(12) United States Patent
Chung et al.

(10) Patent No.: US 9,570,616 B2
(45) Date of Patent: Feb. 14, 2017

(54) DISPLAY DEVICE AND MANUFACTURING METHOD THEREOF

(71) Applicant: SAMSUNG DISPLAY CO., LTD., Yongin-si, Gyeonggi-do (KR)

(72) Inventors: Yungbin Chung, Seoul (KR); Seungkyeng Cho, Hwaseong-si (KR); Chulhyun Baek, Asan-si (KR); Injun Choi, Asan-si (KR); Bogeon Jeon, Gimcheon-si (KR); Eunjeong Cho, Busan (KR); Sunghoon Yang, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/069,043

(22) Filed: Mar. 14, 2016

(65) Prior Publication Data

US 2016/0329430 A1 Nov. 10, 2016

(30) Foreign Application Priority Data

May 4, 2015 (KR) ........................ 10-2015-0062679

(51) Int. Cl.
*H01L 29/786* (2006.01)
*H01L 23/29* (2006.01)
(Continued)

(52) U.S. Cl.
CPC ....... *H01L 29/78606* (2013.01); *G02F 1/1341* (2013.01); *G02F 1/1368* (2013.01);
(Continued)

(58) Field of Classification Search
CPC ........... H01L 29/78606; H01L 21/0217; H01L 29/78669; H01L 23/291; H01L 27/3262; H01L 29/66765; H01L 27/1248; H01L 23/3171; H01L 27/1262; H01L 27/322; G02F 1/1368; G02F 1/1341; G02F 1/134309
See application file for complete search history.

(56) References Cited

U.S. PATENT DOCUMENTS

2010/0001275 A1\* 1/2010 Kim ........................ H01L 27/12
257/57
2011/0260256 A1 10/2011 Koide
(Continued)

FOREIGN PATENT DOCUMENTS

KR 19990061033 A 7/1999
KR 20090053565 A 5/2009
(Continued)

*Primary Examiner* — Kyoung Lee
(74) *Attorney, Agent, or Firm* — Cantor Colburn, LLP

(57) ABSTRACT

A display device includes: a first substrate; a gate electrode on the first substrate; a gate insulating layer on the gate electrode; a semiconductor layer on the gate insulating layer; a source electrode and a drain electrode spaced apart from each other on the semiconductor layer; a first passivation layer including a silicon nitride-based material and on the semiconductor layer, the source electrode, and the drain electrode; a second passivation layer including a silicon nitride-based material and on the first passivation layer; and a third passivation layer including a silicon nitride-based material and on the second passivation layer, where a content ratio of silicon in the first passivation layer is higher than a content ratio of silicon in the second passivation layer, and the content ratio of silicon in the second passivation layer is higher than a content ratio of silicon in the third passivation layer.

20 Claims, 7 Drawing Sheets

(51) Int. Cl.
    *H01L 23/31*         (2006.01)
    *H01L 27/32*         (2006.01)
    *H01L 29/66*         (2006.01)
    *H01L 21/02*         (2006.01)
    *H01L 27/12*         (2006.01)
    *G02F 1/1343*       (2006.01)
    *G02F 1/1368*       (2006.01)
    *G02F 1/1341*       (2006.01)

(52) U.S. Cl.
    CPC .... *G02F 1/134309* (2013.01); *H01L 21/0217* (2013.01); *H01L 23/291* (2013.01); *H01L 23/3171* (2013.01); *H01L 27/1248* (2013.01); *H01L 27/1262* (2013.01); *H01L 27/322* (2013.01); *H01L 27/3262* (2013.01); *H01L 29/66765* (2013.01); *H01L 29/78669* (2013.01)

(56) References Cited

U.S. PATENT DOCUMENTS

2013/0113044 A1    5/2013    Yamazaki et al.
2014/0027764 A1    1/2014    Yamazaki et al.

FOREIGN PATENT DOCUMENTS

| KR | 20100053455 A | 5/2010 |
| KR | 20120093864 A | 8/2012 |
| KR | 20140013972 A | 2/2014 |

\* cited by examiner

DISPLAY DEVICE AND MANUFACTURING METHOD THEREOF

This application claims priority to Korean Patent Application No. 10-2015-0062679, filed on May 4, 2015, and all the benefits accruing therefrom under 35 U.S.C. §119, the content of which in its entirety is herein incorporated by reference.

BACKGROUND

1. Field

Embodiments of the invention relate to a display device in which color distortion caused by a leakage current is effectively prevented, and to a method of manufacturing the display device.

2. Description of the Related Art

Display devices are typically classified into liquid crystal display ("LCD") devices, organic light emitting diode ("OLED") display devices, plasma display panel ("PDP") devices, electrophoretic display ("EPD") devices, and the like, based on a light emitting scheme thereof.

An LCD device may include two substrates disposed to face each other and a liquid crystal layer interposed between the two substrates.

A plurality of thin film transistors ("TFT") and a pixel electrode are disposed on one of the two substrates of the LCD device, and a driving operation of the pixel electrode may be controlled by the TFT. In such an LCD device, the TFT serves as an on/off switch to allow electric charges or electricity to be transmitted to or blocked from flowing to the pixel electrode.

SUMMARY

In a liquid crystal display ("LCD") device, when a leakage current occurs in the TFT, a color may be expressed (i.e., leakage emission) in a pixel which is in an off state, such that display quality may deteriorate. Accordingly, it is desired to prevent occurrence of the leakage current in the TFT.

Embodiments of the invention are directed to a display device with reduced leakage emission by preventing occurrence of a leakage current in a thin film transistor ("TFT") therein.

Embodiments of the invention are directed to a display device and a semiconductor device including a TFT capable of receiving a high gate-off voltage.

According to an exemplary embodiment of the invention, a display device includes: a first substrate; a gate electrode on the first substrate; a gate insulating layer on the gate electrode; a semiconductor layer on the gate insulating layer; a source electrode on the semiconductor layer; a drain electrode on the semiconductor layer and spaced apart from the source electrode; a first passivation layer on the semiconductor layer, the source electrode, and the drain electrode, where the first passivation layer includes a silicon nitride-based material; a second passivation layer on the first passivation layer, where the second passivation layer includes a silicon nitride-based material; and a third passivation layer on the second passivation layer, where the third passivation layer includes a silicon nitride-based material. In such an embodiment, a content ratio of silicon in the first passivation layer is higher than a content ratio of silicon in the second passivation layer, and the content ratio of silicon in the second passivation layer is higher than a content ratio of silicon in the third passivation layer.

In an exemplary embodiment, the silicon nitride-based material of the first passivation layer may have a composition of $SiN_x$, where x may satisfy the following inequation: $0.1 \leq x \leq 0.4$.

In an exemplary embodiment, the silicon nitride-based material of the second passivation layer may include a composition of $SiN_y$, where y may satisfy the following inequation: $0.7 \leq y \leq 1.5$, and the silicon nitride-based material of the third passivation layer may include a composition of $SiN_z$, where z may satisfy the following inequation: $15 \leq z \leq 25$.

In an exemplary embodiment, the silicon nitride-based material of the first passivation layer may include a Si—H group and a N—H group, and a content ratio of the N—H group to the Si—H group ([N—H]/[Si—H]) may be in a range of about 0.1 to about 0.4.

In an exemplary embodiment, the first passivation layer may have a thickness in a range of about 15 nanometers (nm) to about 30 nm.

In an exemplary embodiment, a gate-off voltage in a range of about −4.9 volts (V) to about −2.7 V may be applied to the gate electrode.

In an exemplary embodiment, the display device may further include a first electrode on the first substrate, where the first electrode is connected to the drain electrode.

In an exemplary embodiment, the display device may further include a color filter between the third passivation layer and the first electrode.

In an exemplary embodiment, the display device may further include: a second substrate on the first electrode, and opposite to the first substrate; and a liquid crystal layer between the first substrate and the second substrate.

In an exemplary embodiment, the display device may further include: a light emitting layer on the first electrode; and a second electrode on the light emitting layer.

According to an exemplary embodiment of the invention, a method of manufacturing a display device includes: providing a gate electrode on a first substrate of the display device; providing a gate insulating layer on the gate electrode; providing a semiconductor layer on the gate insulating layer; providing a source electrode and a drain electrode on the semiconductor layer to be spaced apart from each other; providing a first passivation layer on the semiconductor layer, the source electrode and the drain electrode, where the first passivation layer includes a silicon-nitride material; providing a second passivation layer on the first passivation layer, where the second passivation layer includes a silicon-nitride material; and providing a third passivation layer on the second passivation layer, where the third passivation layer includes a silicon-nitride material. In such an embodiment, a content ratio of silicon in the first passivation layer is higher than a content ratio of silicon in the second passivation layer, and the content ratio of silicon in the second passivation layer is higher than a content ratio of silicon in the third passivation layer.

In an exemplary embodiment, each of the providing the first passivation layer, the providing the second passivation layer, and the providing the third passivation layer may include performing a deposition process using $NH_3$ gas, $SiH_4$ gas and $N_2$ gas.

In an exemplary embodiment, the silicon-nitride material of the first passivation layer may include a composition of $SiN_x$ where x may satisfy the following inequation: $0.1 \leq x \leq 0.4$.

In an exemplary embodiment, the silicon-nitride material of the second passivation layer may include a composition of $SiN_y$, where y may satisfy the following inequation:

$0.7 \leq y \leq 1.5$, and the silicon-nitride material of the third passivation layer 173 may include a composition of $SiN_z$, where z may satisfy the following inequation: $15 \leq z \leq 25$.

In an exemplary embodiment, the method may further include: disposing a second substrate to face the first substrate; and providing a liquid crystal layer between the first substrate and the second substrate.

According to an exemplary embodiment of the invention, a semiconductor device includes: a first substrate; a gate electrode on the first substrate; a gate insulating layer on the gate electrode; a semiconductor layer on the gate insulating layer; a source electrode on the semiconductor layer; a drain electrode on the semiconductor layer and spaced apart from the source electrode; a first passivation layer on the semiconductor layer, the source electrode and the drain electrode, where the first passivation layer includes a silicon nitride-based material; a second passivation layer on the first passivation layer, where the second passivation layer includes a silicon nitride-based material; and a third passivation layer on the second passivation layer, where the third passivation layer includes a silicon nitride-based material. In such an embodiment, a content ratio of silicon in the first passivation layer is higher than a content ratio of silicon in the second passivation layer, and the content ratio of silicon in the second passivation layer is higher than a content ratio of silicon in the third passivation layer.

In an exemplary embodiment, the silicon nitride-based material of the first passivation layer may include a composition of $SiN_x$, where x may satisfy the following inequation: $0.1 \leq x \leq 0.4$.

In an exemplary embodiment, the silicon nitride-based material of The second passivation layer may include a composition of $SiN_y$, where y may satisfy the following inequation: $0.7 \leq y \leq 1.5$, and the silicon nitride-based material of the third passivation layer may include a composition of $SiN_z$, where z may satisfy the following inequation: $15 \leq z \leq 25$.

In an exemplary embodiment, the first passivation layer may have a thickness in a range of about 15 nm to about 30 nm.

In an exemplary embodiment, the semiconductor layer may include a silicon-based semiconductor.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the disclosure of invention will be more clearly understood from the following detailed description taken in conjunction with the accompanying drawings, in which.

DETAILED DESCRIPTION

Figure 1:
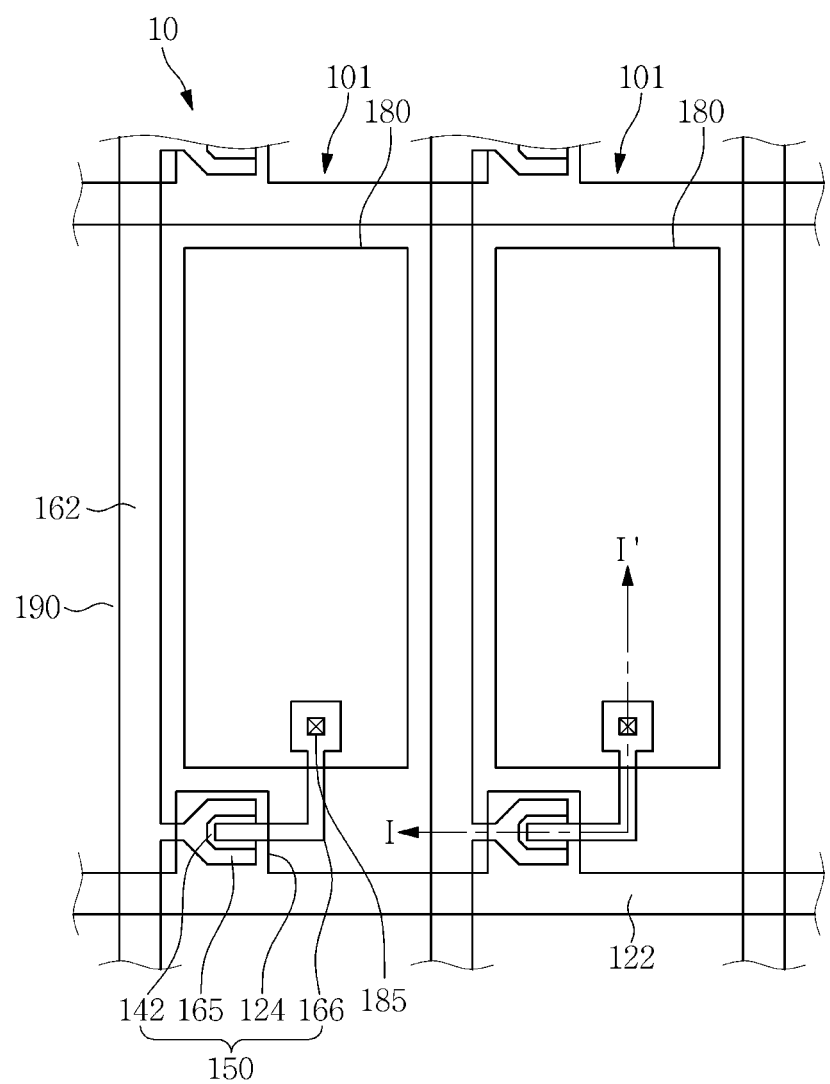
FIG. 1 is a plan view illustrating a display device according to an exemplary embodiment.

Hereinafter, embodiments of the disclosure of invention will be described in more detail with reference to the accompanying drawings.

Although the invention can be modified in various manners and have several embodiments, specific embodiments are illustrated in the accompanying drawings and will be mainly described in the specification. However, the scope of the embodiments of the invention is not limited to the specific embodiments and should be construed as including all the changes, equivalents, and substitutions included in the spirit and scope of the invention.

In the drawings, certain elements or shapes may be simplified or exaggerated to better illustrate the invention, and other elements in an actual product may also be omitted. Like reference numerals refer to like elements throughout the specification. Thus, the drawings are intended to facilitate the understanding of the invention.

In addition, when a layer or element is referred to as being "on" another layer or element, the layer or element may be directly on the other layer or element, or one or more intervening layers or elements may be interposed therebetween.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Some of the parts which are not associated with the description may not be provided to specifically describe embodiments of the invention.

Hereinafter, an exemplary embodiment of the invention will be described with reference to FIGS. 1 and 2.

Figure 2:
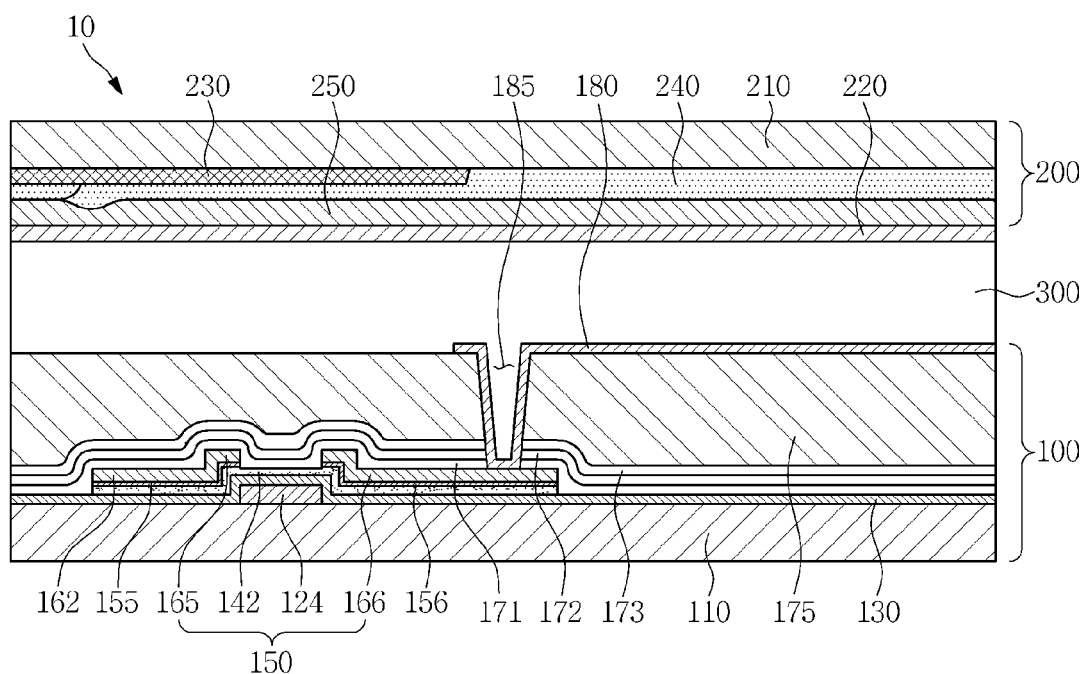
FIG. 2 is a cross-sectional view taken along line I-I' of FIG. 1.

FIG. 1 is a plan view illustrating a display device according to an exemplary embodiment; and FIG. 2 is a cross-sectional view taken along line I-I' of FIG. 1.

In an exemplary embodiment, the display device is a liquid crystal display ("LCD") device 10. However, it is to be understood that scope of the invention is not limited to the LCD device, and features of the invention may also be applicable to other types of display device, e.g., an organic light emitting diode ("OLED") display device.

In such an embodiment, the LCD device 10 includes a first substrate 110, a second substrate 210 disposed to face the first substrate 110, and a liquid crystal layer 300 interposed between the first substrate 110 and the second substrate 210.

In reference to FIGS. 1 and 2, the LCD device 10 includes a lower panel 100, an upper panel 200, and the liquid crystal layer 300 interposed between the lower panel 100 and the upper panel 200.

The lower panel 100 includes the first substrate 110, a thin film transistor ("TFT") 150 on the first substrate 110, passivation layers 171, 172 and 173 on the TFT 150, a planarization layer 175 on the passivation layers 171, 172 and 173, and a first electrode 180 on the planarization layer 175.

The first substrate 110 may include an insulating substrate including or formed of a transparent material, such as glass or plastic, for example.

Gate wirings 122 and 124, which transmit a gate signals are disposed on the first substrate 110. The gate wirings 122 and 124 include a gate line 122 extending, for example, in a transverse direction, and a gate electrode 124 protruding from the gate line 122 to have a projection shape. The gate electrode 124, along with a source electrode 165, a drain electrode 166 and a semiconductor layer 142, which will be described later in detail, constitutes or collectively defined the TFT 150.

In such an embodiment, a storage wiring (not illustrated) may further be disposed on the first substrate 110 to form a storage capacitor, along with the first electrode 180. The storage wiring may include or be formed of a material the same as that of the gate wirings 122 and 124, and may be disposed on a layer the same as a layer on which the gate wirings 122 and 124 are disposed.

The gate wirings 122 and 124 may each include at least one selected from aluminum (Al) or alloys thereof, silver (Ag) or alloys thereof, copper (Cu) or alloys thereof, molybdenum (Mo) or alloys thereof, chromium (Cr), tantalum (Ta), and titanium (Ti), for example.

In such an embodiment, the gate wirings 122 and 124 may have a multilayer structure including two conductive layers (not illustrated) having different physical properties from each other. In an exemplary embodiment, one of the two conductive layers may include a metal having a low resistivity, for example, an aluminum (Al)-based metal, a silver (Ag)-based metal, or a copper (Cu)-based metal, to decrease a signal delay or a voltage drop of the gate wirings 122 and 124. In such an embodiment, the other of the two conductive layers may include a material that is found to impart a high contact property with transparent conductive oxide ("TCO"), for example, indium tin oxide ("ITO"), indium zinc oxide ("IZO"), or aluminum zinc oxide ("AZO"). In one exemplary embodiment, for example, the other of the two conductive layers may include at least one selected from a molybdenum-based metal, chromium, titanium, and tantalum.

In an exemplary embodiment, where the gate wirings 122 and 124 may have a multilayer structure including two conductive layers, the multilayer structure may include: two conductive layers including a chromium (Cr) lower film and an aluminum (Al) upper film; two conductive layers including an aluminum (Al) lower film and a molybdenum (Mo) upper film; or two conductive layers including a titanium (Ti) lower film and a copper (Cu) upper film. However, the invention is not limited thereto, and the gate wirings 122 and 124 may include or be formed of various metals and conductors.

In an exemplary embodiment, a gate insulating layer 130 is disposed on the first substrate 110 and the gate wirings 122 and 124. In an exemplary embodiment, the gate insulating layer 130 may include silicon oxide ($SiO_x$) or silicon nitride ($SiN_x$). In an exemplary embodiment, the gate insulating layer 130 may include aluminum oxide, titanium oxide, tantalum oxide, or zirconium oxide.

In an exemplary embodiment, a semiconductor layer 142, which forms a channel of the TFT 150, is disposed on the gate insulating layer 130. At least a portion of the semiconductor layer 142 may overlap the gate electrode 124. In an exemplary embodiment, the semiconductor layer 142 includes a silicon-based semiconductor. In one exemplary embodiment, for example, the semiconductor layer 142 includes or is formed of amorphous silicon (hereinafter "a-Si").

However, such an embodiment is not limited thereto, and the semiconductor layer 142 may include or be formed of an oxide semiconductor that includes at least one of gallium (Ga), indium (In), tin (Sn), and zinc (Zn).

Ohmic contact layers 155 and 156 are disposed on the semiconductor layer 142. The ohmic contact layers 155 and 156 may serve to enhance a contact property between the source electrode 165 and/or the drain electrode 166, and the semiconductor layer 142.

In one exemplary embodiment, for example, the ohmic contact layers 155 and 156 may include or be formed of amorphous silicon doped with n-type impurities at high concentration (hereinafter "n+a-Si"). In an exemplary embodiment where the contact property between the source electrode 165 and/or the drain electrode 166, and the semiconductor layer 142 is sufficiently secured, the ohmic contact layers 155 and 156 may be omitted.

Data wirings 162, 165 and 166 are disposed on the ohmic contact layers 155 and 156 and the gate insulating layer 130. The data wirings 162, 165 and 166 include a data line 162 disposed in a direction intersecting the gate line 122, for example, a longitudinal direction, the source electrode 165 branched off from the data line 162 to extend onto the semiconductor layer 142, and the drain electrode 166 spaced apart from the source electrode 165 and disposed above the semiconductor layer 142 to face the source electrode 165 with respect to a channel region of the TFT 150. In an exemplary embodiment, the drain electrode 166 may extend from an upper portion of the semiconductor layer 142 to a lower portion of the first electrode 180.

In an exemplary embodiment, a pixel region 101 may be defined by the data line 162 and the gate line 122, but is not limited thereto. Alternatively, the pixel region 101 may be defined by a black matrix (not illustrated). The pixel region 101, for example, may include a red pixel region, a green pixel region, and a blue pixel region. However, such an embodiment is not limited thereto, and the pixel region 101 may further include a white pixel region in an alternative exemplary embodiment.

Passivation layers 171, 172 and 173 are disposed above the data wirings 162, 165 and 166, an exposed portion of the semiconductor layer 142, and an exposed portion of the gate insulating layer 130.

In an exemplary embodiment, the first passivation layer 171, which includes or is formed of a silicon nitride-based material, is disposed on the semiconductor layer 142, the source electrode 165 and the drain electrode 166. In such an embodiment, the second passivation layer 172, which includes or is formed of a silicon nitride-based material, is disposed on the first passivation layer 171. In such an embodiment, the third passivation layer 173, which includes or is formed of a silicon nitride-based material, is disposed on the second passivation layer 172. In an exemplary embodiment, the first passivation layer 171 has a content ratio of silicon higher than that of the second passivation layer 172, and the second passivation layer 172 has a content ratio of silicon higher than that of the third passivation layer 173.

The first passivation layer 171 contacts a channel region of the semiconductor layer 142, the source electrode 165 and the drain electrode 166.

In an exemplary embodiment, the first passivation layer 171 has a composition represented by $SiN_x$, and x may be in a range of 0.1 to 0.4 or satisfy the following inequation: $0.1 \le x \le 0.4$.

In an exemplary embodiment, the first passivation layer 171 has a Si—H group and a N—H group, and the content of silicon (Si) may be represented by a content ratio of the N—H group to the Si—H group ([N—H]/[Si—H]). Herein, the content ratio is a ratio of the number of the Si—H group to the number of the N—H group. In one exemplary embodiment, for example, the first passivation layer 171 may have a content ratio of the N—H group to the Si—H group ([N—H]/[Si—H]) in a range of about 0.1 to about 0.4. That is, the content ratio of the N—H group to the Si—H group ([N—H]/[Si—H]) satisfy the following inequation: $0.1 \le [N—H]/[Si—H] \le 0.4$. In one exemplary embodiment, for example, the first passivation layer 171 may have a content ratio of the N—H group to the Si—H group ([N—H]/[Si—H]) in a range of about 0.2 to about 0.3.

Accordingly, in such an embodiment, the first passivation layer 171 may be a silicon (Si) rich layer in which silicon (Si) has a high content ratio than that of nitrogen (N).

The silicon (Si) rich-type silicon nitride having a high content of silicon (Si) compared to the content of nitrogen (N) has a characteristic of a positive charge, and may function as an electron acceptor. Accordingly, when a leakage electron flows into a channel region in a state where the gate electrode is off, the first passivation layer 171 may collimate the leakage electrons to effectively prevent a leakage current from occurring in the channel region. Accordingly, a pixel may be effectively prevented from emitting light due to the leakage current.

When the thickness of the first passivation layer 171 is significantly thin, collimation of the leakage electrons by the first passivation layer 171 may not be effectively performed. On the other hand, when the thickness of the first passivation layer 171 is significantly thick, a total thickness of the passivation layers 171, 172 and 173 may increase such that thickness of the display device may be increased. In consideration of the foregoing, in an exemplary embodiment, the first passivation layer 171 may have a thickness in a range of about 10 nanometers (nm) to about 30 nm. In one exemplary embodiment, for example, the first passivation layer 171 may have a thickness in a range of about 15 nm to about 20 nm.

In an exemplary embodiment, the first passivation layer 171 may have a refractive index in a range of about 1.8 to about 2.5. In one exemplary embodiment, for example, the first passivation layer 171 may have a refractive index in a range of about 2.0 to about 2.1.

However, such an embodiment is not limited thereto, and the thickness of the first passivation layer 171 and the content ratio of silicon (Si) of the first passivation layer 171 may vary depending on the type and size of the display device and the type and size of the semiconductor layer 142.

The second passivation layer 172 has a composition of $SiN_y$, and y may be in a range of about 0.7 to about 1.5 or satisfy the following inequation: $0.7 \le y \le 1.5$. Further, the third passivation layer 173 has a composition of $SiN_z$, and z may be in a range of about 15 to about 25 or satisfy the following inequation: $15 \le y \le 25$.

In an exemplary embodiment, the second passivation layer 172 and the third passivation layer 173 may have a Si—H group and a N—H group. In such an embodiment, the second passivation layer 172 may have a content ratio of the N—H group to the Si—H group ([N—H]/[Si—H]) in a range of about 0.7 to about 1.5. In such an embodiment, the third passivation layer 173 may have a content ratio of the N—H group to the Si—H group ([N—H]/[Si—H]) in a range of about 15 to about 25. In one exemplary embodiment, for example, the second passivation layer 172 may have a content ratio of the N—H group to the Si—H group ([N—H]/[Si—H]) in a range of about 0.9 to about 1.3. In one exemplary embodiment, for example, the third passivation layer 173 may have a content ratio of the N—H group to the Si—H group ([N—H]/[Si—H]) in a range of about 21 to about 25.

The second passivation layer 172 and the third passivation layer 173 may have no particular limitation in the thickness thereof. In one exemplary embodiment, for example, the second passivation layer 172 and the third passivation layer 173 may each have a thickness in a range of about 10 nm to about 1000 nm.

In an exemplary embodiment, the second passivation layer 172 and the third passivation layer 173 may have a refractive index in a range of about 1.7 to about 2.2, for example, a refractive index in a range of about 1.8 to about 2.0.

In an exemplary embodiment, the first passivation layer 171, the second passivation layer 172 and the third passivation layer 173 may be formed by deposition. In one exemplary embodiment, for example, the first passivation layer 171, the second passivation layer 172, and the third passivation layer 173 may be formed by a plasma enhanced chemical vapor deposition ("PECVD") method using $NH_3$ gas, $SiH_4$ gas, and $N_2$ gas. In such an embodiment, by adjusting a speed of injecting the $NH_3$ gas, the $SiH_4$ gas, and the $N_2$ gas, the content ratio between nitrogen (N) and silicon (Si) forming the first passivation layer 171, the second passivation layer 172 and the third passivation layer 173 may be adjusted.

A structure of the first passivation layer 171, the second passivation layer 172 and the third passivation layer 173 may be verified by a transmission electron microscopy ("TEM") and the like, and the content of silicon (Si) and nitrogen (N) included in the first passivation layer 171, the second passivation layer 172 and the third passivation layer 173 may be verified by an x-ray photoelectron spectroscopy ("XPS") or a Fourier Transform Infrared Spectroscopy ("FTIR").

A structure including the first substrate 110, the TFT 150, the first passivation layer 171, the second passivation layer 172, and the third passivation layer 173 may be referred to as a semiconductor device. Such a semiconductor device may be used in another electric or electronic device other than the display device.

FIGS. 1 and 2 merely show a structure of the TFT 150 in one exemplary embodiment, and the structure of the TFT 150 is not limited thereto.

In an exemplary embodiment, a planarization layer 175 is disposed on the third passivation layer 173. The planarization layer 175 may have a thickness in a range of about 1.0 micrometer (μm) to about 2.5 μm.

The planarization layer 175 may have a monolayer or multilayer structure including, for example, silicon oxide, silicon nitride, a photosensitive organic material, or a low dielectric constant insulating material such as a-Si:C:O or a-Si:O:F.

The planarization layer 175 may planarize an upper portion of the TFT 150. In an exemplary embodiment, where the upper portion of the TFT 150 is planarized by the third passivation layer 173, the planarization layer 175 may be omitted.

A portion of the first passivation layer 171, the second passivation layer 172, the third passivation layer 173 and the planarization layer 175 may be removed to thereby form a contact hole 185 through which a portion of the drain electrode 166 disposed below the first electrode 180 is exposed.

In an exemplary embodiment, the first electrode 180 is disposed on the planarization layer 175 to be electrically connected to the drain electrode 166 through the contact hole 185. The first electrode 180 may be formed of TCO, such as ITO, IZO, or AZO. According to an exemplary embodiment, the first electrode 180 may be a pixel electrode, and may be disposed in the pixel region 101.

Although not illustrated, a lower alignment layer may be disposed on the first electrode 180 and the planarization layer 175. The lower alignment layer may be a homeotropic layer and may include a photosensitive material. In one exemplary embodiment, for example, the lower alignment layer may include at least one material selected from: polyamic acid, polysiloxane, and polyimide.

The upper panel 200 includes the second substrate 210, a light shielding layer 230, a color filter 240, an overcoat layer 250 and a second electrode 220.

The second substrate 210 includes or is formed of a transparent material including glass or plastic, for example.

In an exemplary embodiment, the light shielding layer 230 is disposed on the second substrate 210. The light shielding layer 230 may be referred to as a black matrix, and may serve to divide the plurality of color filters 240 from each other to define the pixel region.

In an exemplary embodiment, the light shielding layer 230 may effectively prevent light supplied from a backlight unit (not illustrated) from being dissipated outwards therethrough, and effectively prevent externally incident light from being irradiated onto the gate line 122, the data line 162, and the TFT 150. The light shielding layer 230 may be disposed to overlap the gate line 122, the data line 162 and the TFT 150. In one exemplary embodiment, for example, the light shielding layer 230 may have a lattice structure disposed along the gate line 122 and the data line 162.

In an exemplary embodiment, the color filter 240 is disposed in the pixel region divided by the light shielding layer 230. The color filter 240 may include a red color filter, a green color filter, and a blue color filter. However, the type of the color filter 240 may not be limited thereto.

The red color filter, the green color filter and the blue color filter are disposed corresponding to the red pixel region, the green pixel region and the blue pixel region, respectively.

The color filter 240 may have a thickness in a range of about 2 μm to about 4 μm. However, the thickness of the color filter 240 may not be limited thereto.

In an exemplary embodiment, the overcoat layer 250 is disposed on the color filter 240. The overcoat layer 250 may planarize an upper portion of the color filter 240 and protect the color filter 240. The overcoat layer 250 may include or be formed of, for example, an acrylic epoxy-based material.

In an exemplary embodiment, the second electrode 220 is disposed on the overcoat layer 250. The second electrode 220 may be a common electrode.

The second electrode 220 may include or be formed of TCO, such as ITO, IZO, or AZO.

Although not illustrated, the upper panel 200 may further include an upper alignment layer. The upper alignment layer may be disposed on the second electrode 220. The upper alignment layer may include or be formed of a material the same as that of the lower alignment layer.

A column spacer (not illustrated) may be disposed between the lower panel 100 and the upper panel 200. The column spacer maintains a uniform interval between the lower panel 100 and the upper panel 200 to maintain a cell gap of the LCD device 10.

When surfaces of the first substrate 110 and the second substrate 210 facing each other therebetween are defined as upper surfaces (or inner surfaces) of the corresponding substrate, respectively, and surfaces of the first substrate 110 and the second substrate 210 disposed opposite to the upper surfaces thereof, respectively, are defined as lower surfaces (or outer surfaces) of the corresponding substrate, respectively, polarizers (not illustrated) may further be disposed on the lower surface of the first substrate 110 and the lower surface of the second substrate 210, respectively.

In an exemplary embodiment, the liquid crystal layer 300 is disposed in a space between the lower panel 100 and the upper panel 200. The liquid crystal layer 300 may include liquid crystal molecules. The liquid crystal molecules of the liquid crystal layer 300 may have a structure in which a major or longitudinal axis thereof is aligned in a direction parallel to one of the lower panel 100 and the upper panel 200, and the direction is spirally twisted at an angle of about 90 degrees from a rubbing direction of the lower panel 100 to the upper panel 200. Alternatively, the liquid crystal layer 300 may include homeotropic liquid crystal molecules.

Hereinafter, an alternative exemplary embodiment of a display device will be described with reference to FIG. 3.

Figure 3:
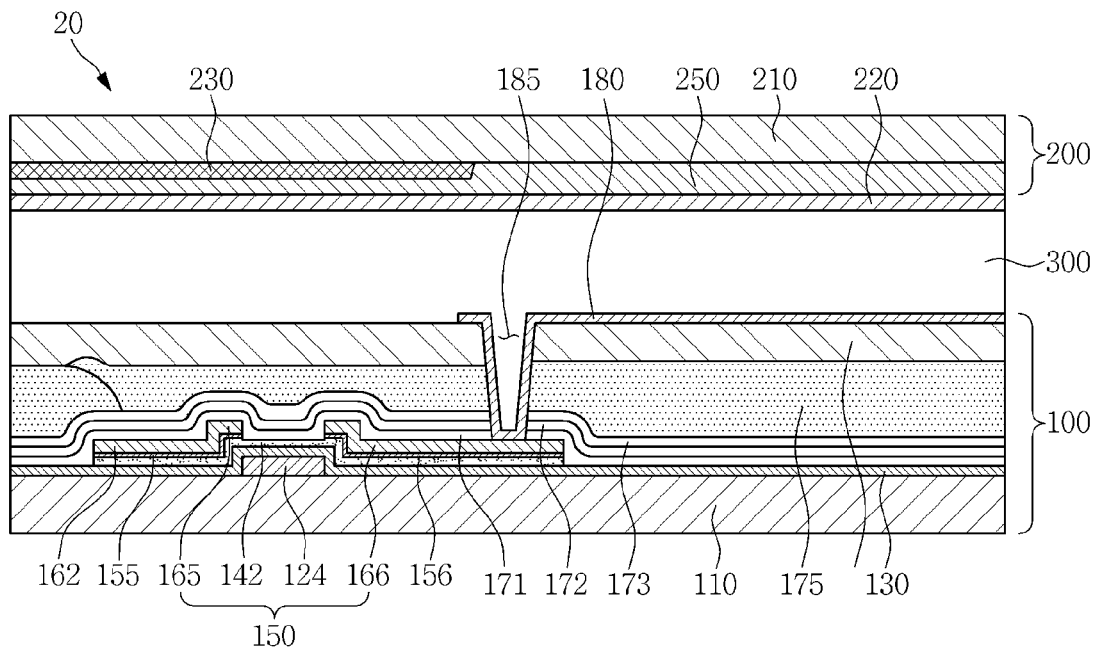
FIG. 3 is a cross-sectional view illustrating a display device according to an alternative exemplary embodiment.

FIG. 3 is a cross-sectional view illustrating a display device according to an alternative exemplary embodiment.

In such an embodiment, the display device may be an LCD device 20, and may differ from an exemplary embodiment of the LCD device 10 described above with reference to FIG. 1 in that a color filter 240 is disposed in the lower panel 100. The same or like elements shown in FIG. 3 have been labeled with the same reference characters as used above to describe exemplary embodiments of the display device of FIGS. 1 and 2, and any repetitive detailed description thereof will hereinafter be omitted or simplified.

In an exemplary embodiment, as shown in FIG. 3, a TFT 150 is disposed on a first substrate 110, and a first passivation layer 171, a second passivation layer 172 and a third passivation layer 173 may be sequentially disposed on the TFT 150.

In an exemplary embodiment, a color filter 240 is disposed on the third passivation layer 173.

The color filter 240 may include a red color filter, a green color filter, and a blue color filter. The red color filter, the green color filter and the blue color filter are disposed corresponding to a red pixel region, a green pixel region and a blue pixel region, respectively.

In an exemplary embodiment, a planarization layer 175 is disposed on the color filter 240.

In an exemplary embodiment, a portion of the first passivation layer 171, the second passivation layer 172, the third passivation layer 173, the color filter 240 and the planarization layer 175 is removed to thereby form a contact hole 185 through which a portion of a drain electrode 166 disposed below a first electrode 180 may be exposed.

In an exemplary embodiment, the first electrode 180 is disposed on the planarization layer 175 to be electrically connected to the drain electrode 166 through the contact hole 185.

Figure 4:
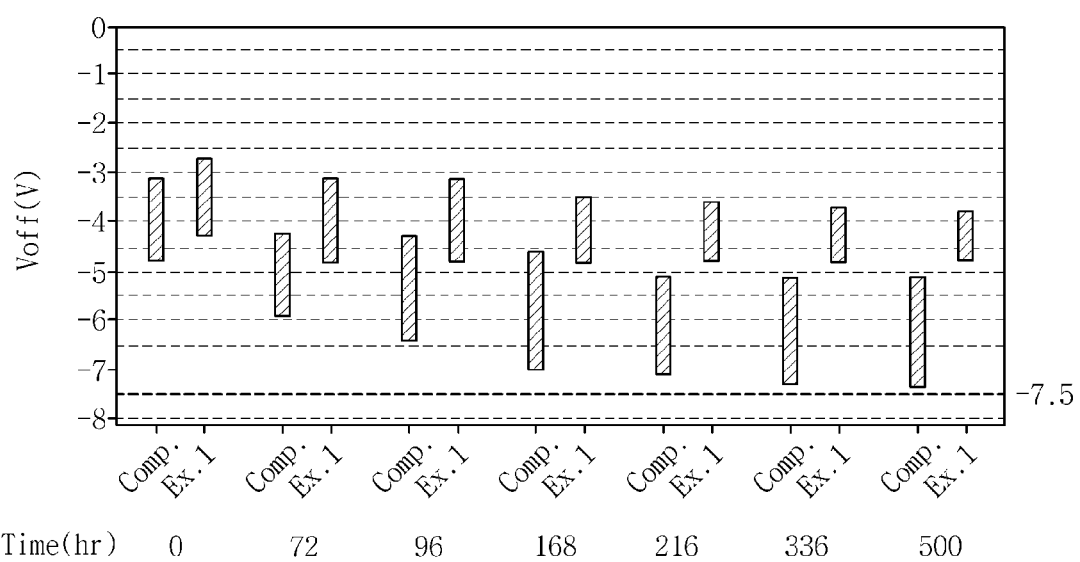
FIG. 4 is a gate-off voltage distribution graph of a display device.

FIG. 4 is a gate-off voltage distribution graph of a display device.

In detail, distribution of a gate-off voltage (Voff) of an LCD device according to a comparative embodiment "Comp." which only includes the second passivation layer 172 and the third passivation layer 173 as a passivation layer and distribution of a gate-off voltage (Voff) of an LCD device according to an exemplary embodiment "Ex. 1" which includes the first passivation layer 171, the second passivation layer 172 and the third passivation layer 173 as a passivation layer are illustrated in FIG. 4.

In FIG. 4, the gate-off voltage Voff refers to a voltage applied to the gate electrode 124 to prevent current from flowing through the TFT 150. That is, a voltage to be applied to the gate electrode 124 to prevent a pixel from emitting light by a leakage current of the TFT in a state where the pixel is in an off state is referred to as the gate-off voltage Voff in FIG. 4.

The gate-off voltage Voff corresponds to a voltage for maintaining the color luminance of the pixel, and is represented by a relative potential difference with respect to the common voltage. As an absolute value of the gate-off voltage Voff increases, a greater level of power is consumed to maintain a voltage level.

As the LCD device "according to an exemplary embodiment Ex. 1" and the LCD device according to the comparative embodiment "Comp. 1" are driven for 500 hours, the gate-off voltage Voff is measured at time points of an initial time (0 hour), 72 hours, 96 hours, 168 hours, 216 hours, 336 hours, and 500 hours, respectively. The gate-off voltage Voff is measured a plurality of times at each time point, and a deviation thereof is represented by a bar, in FIG. 4.

As shown in FIG. 4, the gate-off voltage Voff of the LCD device according to the comparative embodiment "Comp. 1" is in a range of about −3.1 volts (V) to about −7.4 V. On the other hand, the LCD device "Ex. 1" according to the first exemplary embodiment is in a range of about −2.7 V to about −4.9 V. That is, a gate-off voltage Voff of about −5.0 V or more is applied to the LCD device according to the first exemplary embodiment "Ex. 1".

As shown in FIG. 4, while the LCD device according to the comparative embodiment "Comp." may lower the gate-off voltage Voff down to −7.4 V to stably or effectively prevent a leakage current, the LCD device according to an exemplary embodiment "Ex. 1" may lower the gate-off voltage Voff down to −4.9 V to stably or effectively prevent a leakage current.

Accordingly, the LCD device according to an exemplary embodiment "Ex. 1" may have a voltage gain, that is, a gate-off voltage (Voff) gain, of about 2.5 V with respect to the LCD device according to the comparative embodiment "Comp.". Accordingly, the LCD device according to an exemplary embodiment "Ex. 1" may consume a less power than a power the LCD device according to the comparative embodiment "Comp." consumes.

Hereinafter, an exemplary embodiment of a method of manufacturing a display device 30 and a semiconductor device (refer to FIG. 5F) will be described with reference to FIGS. 5A to 5J.

FIGS. 5A to 5J are views illustrating processes of a method of manufacturing a display device, according to an exemplary embodiment.

In such an embodiment, the display device is an LCD device 30, and ohmic contact layers 155 and 156 may be omitted therein.

Figure 5A:
FIGS. 5A to 5J are views illustrating processes of a method of manufacturing a display device, according to an exemplary embodiment.

In an exemplary embodiment, as shown in FIG. 5A, a gate electrode 124 is provided, e.g., formed, on a first substrate 110 which is formed of a transparent material such as glass or plastic. In such an embodiment, a gate line (not illustrated) is also provided along with the gate electrode 124 to thereby form gate wirings 122 and 124.

In such an embodiment, a first pattern mask may be used to form the gate electrode 124 and the gate line.

Figure 5B:

In an exemplary embodiment, as shown in FIG. 5B, a gate insulating layer 130 including silicon nitride ($SiN_x$) or silicon oxide ($SiO_x$) is provided or formed on the gate electrode 124. The gate insulating layer 130 may have a multilayer structure including two or more insulating layers having different physical or chemical properties from each other.

In such an embodiment, a semiconductor-forming material 140 is coated over an entire surface of the gate insulating layer 130.

The semiconductor-forming material 140 may be a silicon-based semiconductor material such as amorphous silicon or polycrystalline silicon. In an exemplary embodiment, where the semiconductor-forming material 140 shown in FIG. 5B is amorphous silicon, a laser may be irradiated onto the semiconductor-forming material 140 for the amorphous silicon to be crystallized.

However, such an embodiment is not limited thereto, and alternatively, an oxide semiconductor material may be used as the semiconductor-forming material 140. The oxide semiconductor material may include at least one selected from zinc (Zn), gallium (Ga), indium (In) and tin (Sn).

Although not illustrated, an ohmic contact member may be provided on the semiconductor-forming material 140 to form the ohmic contact layer.

Figure 5C:
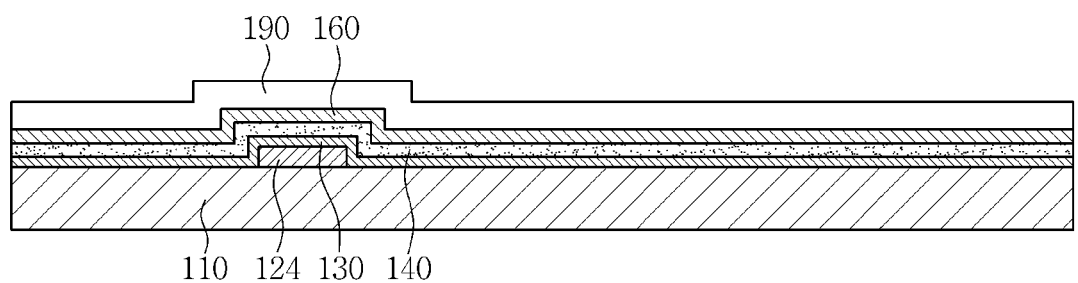

In an exemplary embodiment, as shown in FIG. 5C, a conductive material 160 for forming the data wiring, for example, a data line 162, a source electrode 165 and a drain electrode 166 is coated on the semiconductor-forming material 140, and a photoresist 190 is coated on the conductive material 160.

In such an embodiment, conductive materials commonly used to form a conductive wiring may be used as the conductive material 160, and a material forming the gate line and the gate electrode 124 may be used as the conductive material 160. In such an embodiment, photoresists commonly used to form a metal pattern may be used as the photoresist 190.

Figure 5D:
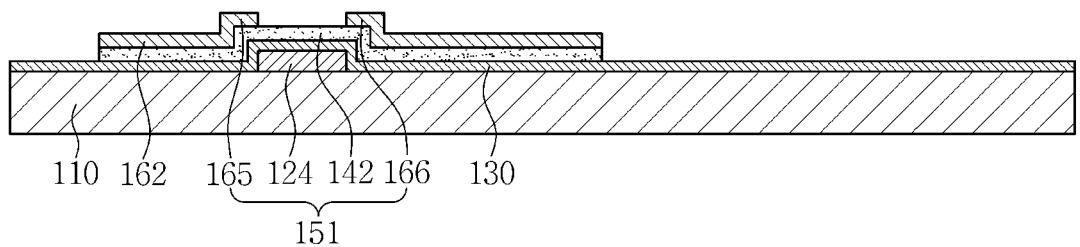

In an exemplary embodiment, as shown in FIG. 5D, a semiconductor layer 142 and the data wiring, for example, the data line 162, the source electrode 165 and the drain electrode 166, may be formed through selective light exposure and etching using a second pattern mask.

The semiconductor layer 142 is provided or formed on the gate insulating layer 130 and overlaps at least a portion of the gate electrode 124.

The data wiring includes the data line 162, the source electrode 165 and the drain electrode 166. The data line 162 intersects the gate line 122. The source electrode 165 is branched off from the data line 162 to extend onto the semiconductor layer 142. The drain electrode 166 is spaced apart from the source electrode 165 to be disposed on an upper portion of the semiconductor layer 142.

The gate electrode 124, the semiconductor layer 142, the source electrode 165 and the drain electrode 166 constitute or collectively define a TFT 151.

Figure 5E:
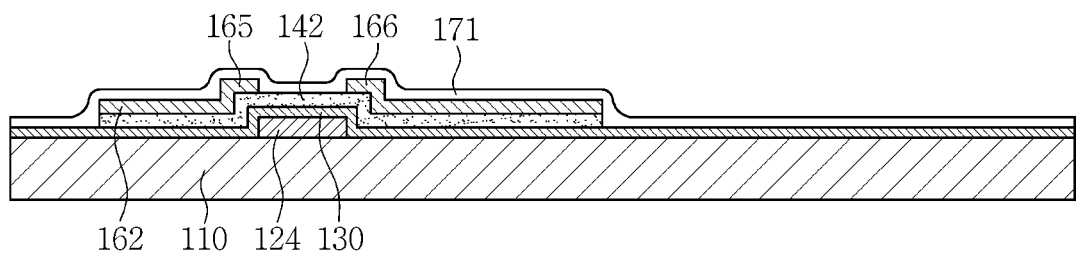

In reference to FIG. 5E, a first passivation layer 171 including or formed of silicon nitride is provided or formed on the semiconductor layer 142, the source electrode 165 and the drain electrode 166.

The first passivation layer 171 may be formed through deposition. In one exemplary embodiment, for example, the first passivation layer 171 may be formed through a PECVD method using $NH_3$ gas, $SiH_4$ gas, and $N_2$ gas. In such an embodiment, by adjusting a speed of injecting the $NH_3$ gas, the $SiH_4$ gas, and the $N_2$ gas, the content ratio between nitrogen (N) and silicon (Si) forming the first passivation layer 171 may be adjusted.

In such an embodiment, the first passivation layer 171 has a composition represented by $SiN_x$, and x may be in a range of about 0.1 to about 0.4 or satisfy the following inequation: $0.1 \leq x \leq 0.4$.

In such an embodiment, the first passivation layer 171 has a Si—H group and a N—H group, and the content ratio of the N—H group to the Si—H group ([N—H]/[Si—H]) is in a range of about 0.1 to about 0.4.

The first passivation layer 171 may have a thickness in a range of about 10 nm to about 30 nm. In one exemplary embodiment, for example, the first passivation layer 171 may have a thickness in a range of about 15 nm to about 20 nm. In such an embodiment, the first passivation layer 171 may have a refractive index in a range of about 1.8 to about 2.5, for example, in a range of about 2.0 to about 2.1.

Figure 5F:
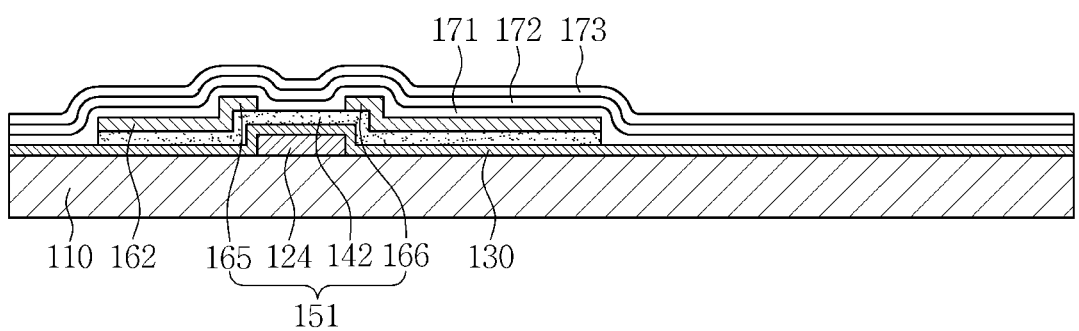

In an exemplary embodiment, as shown in FIG. 5F, a second passivation layer 172 including or formed of silicon nitride is provided or formed on the first passivation layer 171, and a third passivation layer 173 including or formed of silicon nitride is provided or formed on the second passivation layer 172. Accordingly, a semiconductor device is manufactured. The semiconductor device includes the TFT 151.

In an exemplary embodiment, the second passivation layer 172 has a composition of $SiN_y$, and y may be in a range of about 0.7 to about 1.5 or satisfy the following inequation: $0.7 \leq y \leq 1.5$. In an exemplary embodiment, the third passivation layer 173 has a composition of $SiN_z$, and z may be in a range of about 15 to about 25 or satisfy the following inequation: $15 \leq y \leq 25$.

In an exemplary embodiment, the second passivation layer 172 may have a content ratio of a N—H group to a Si—H group ([N—H]/[Si—H]) in a range of about 0.7 to about 1.5. In an exemplary embodiment, the third passivation layer 173 may have a content ratio of a N—H group to a Si—H group ([N—H]/[Si—H]) in a range of about 15 to about 25.

The second passivation layer 172 and the third passivation layer 173 may have a thickness in a range of about 10 nm to about 1000 nm.

Figure 5G:
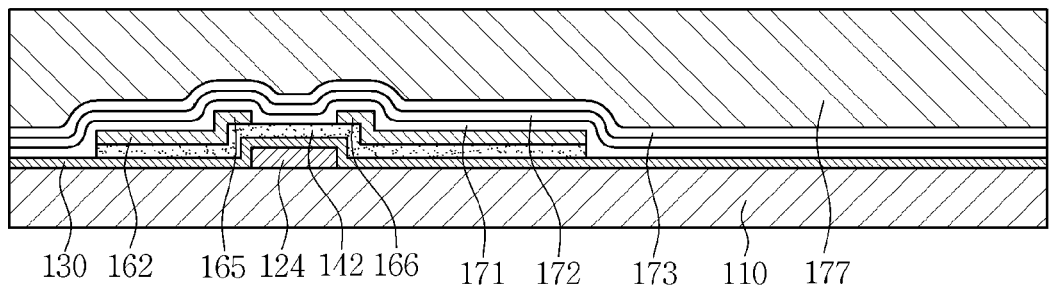

In an exemplary embodiment, as shown in FIG. 5G, a planarization layer 175 is provided or formed on the third passivation layer 173.

The planarization layer 175 may have a monolayer or multilayer structure including, for example, silicon oxide, silicon nitride, a photosensitive organic material, or a low dielectric constant insulating material such as a-Si:C:O or a-Si:O:F. The planarization layer 175 has a thickness in a range of about 1.0 μm to about 2.5 μm.

Figure 5H:
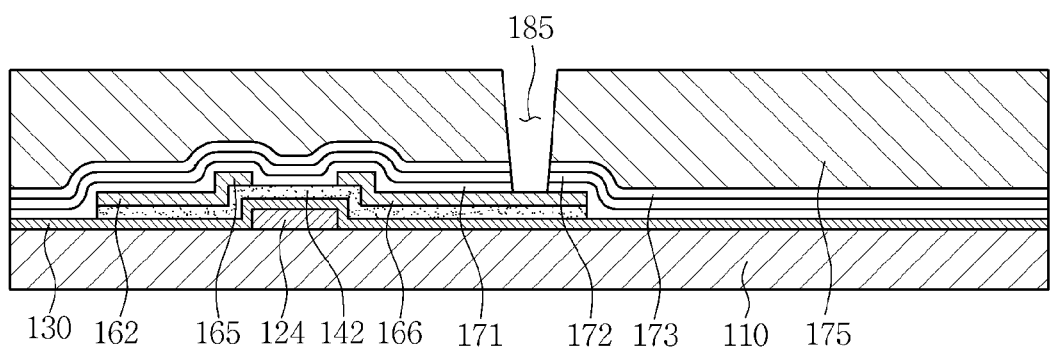

In an exemplary embodiment, as shown in FIG. 5H, a portion of the first passivation layer 171, the second passivation layer 172, the third passivation layer 173 and the planarization layer 175 is removed, and thereby a contact hole 185, through which a portion of the drain electrode 166 is exposed, is formed. In such an embodiment, light exposure and etching may be performed using a third pattern mask to form the contact hole 185.

Figure 5I:
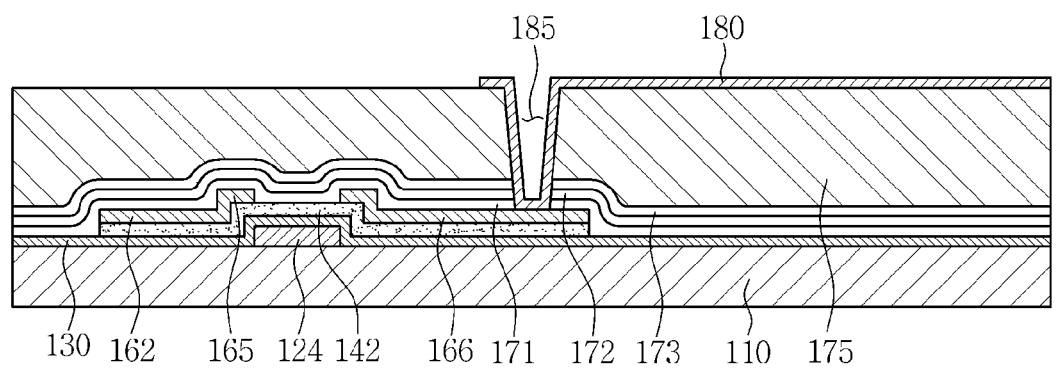

In an exemplary embodiment, as shown in FIG. 5I, a first electrode 180 electrically connected to the drain electrode 166 through the contact hole 185 is provided or formed on the planarization layer 175, and thereby a lower panel 100 is manufactured. The first electrode 180 includes or is formed of TCO, such as ITO, IZO, or AZO. In an exemplary embodiment, light exposure and etching may be performed using a fourth pattern mask to form the first electrode 180.

Figure 5J:
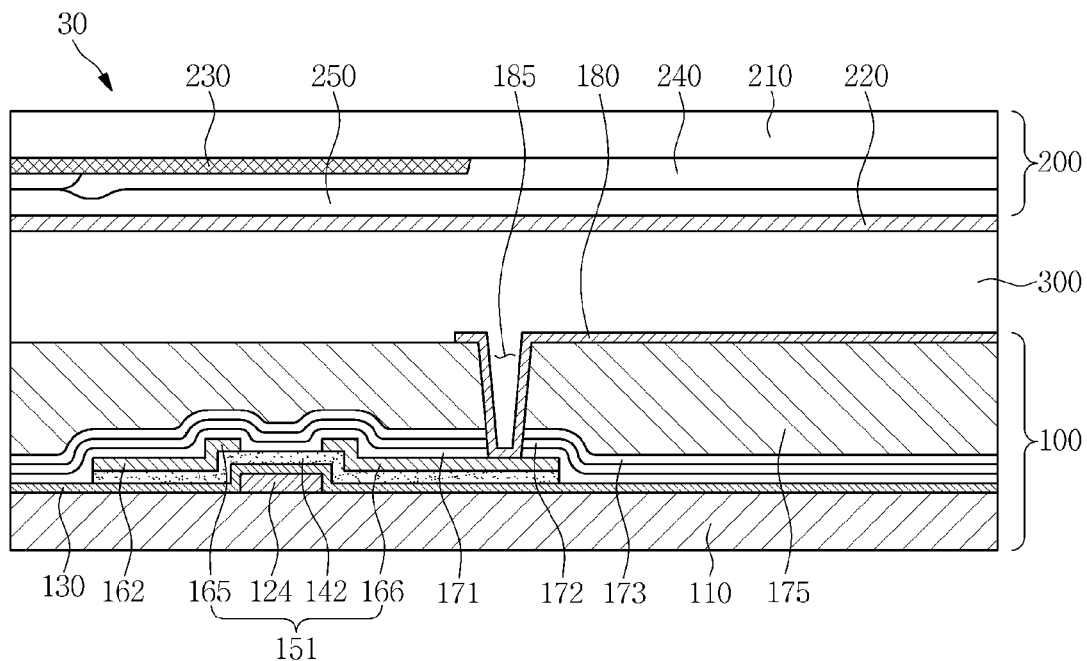

In such an embodiment, as shown in FIG. 5J, an upper panel 200 is provided, e.g., disposed, on the lower panel 100 to face the lower panel 100, and a liquid crystal layer 300 is provided between the lower panel 100 and the upper panel 200, such that the LCD device 30 may be manufactured. The upper panel 200 includes a second substrate 210, a light shielding layer 230, a color filter 240, an overcoat layer 250 and a second electrode 220.

Hereinafter, another alternative exemplary embodiment will be described with reference to FIG. 6.

Figure 6:
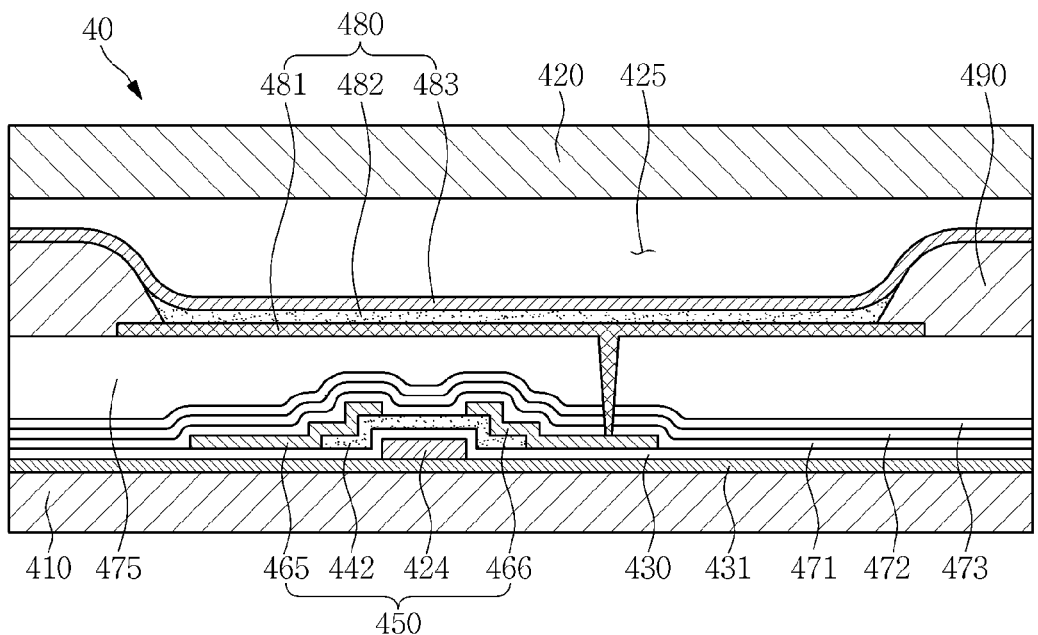
FIG. 6 is a cross-sectional view illustrating a display device according to another alternative exemplary embodiment.

FIG. 6 is a cross-sectional view illustrating a display device according to another alternative exemplary embodiment. In such an embodiment, the display device may be an OLED display device 40.

In such an embodiment, the OLED display device 40 includes a first substrate 410, a buffer layer 431, a TFT 450, a planarization layer 475 and an OLED 480.

The first substrate 410 may include or be formed of an insulating material including glass, quartz, ceramic or plastic, for example. Alternatively, the first substrate 410 may include or be formed of a metal material, such as stainless steel.

In an exemplary embodiment, the buffer layer 431 is disposed on the first substrate 410. The buffer layer 431 may include at least one layer selected from various inorganic layers and organic layers. The buffer layer 431 effectively prevents infiltration of undesirable elements, such as moisture, into the TFT 450 or OLED 480, and planarizes a surface. In an alternative exemplary embodiment, the buffer layer 431 may be omitted.

In an exemplary embodiment, the TFT 450 is disposed on the buffer layer 431.

In such an embodiment, a gate electrode 424 is disposed on the buffer layer 431, and a gate insulating layer 430 is disposed on the gate electrode 424. A semiconductor layer 442 is disposed on the gate insulating layer 430, and a source electrode 465 and a drain electrode 466 are disposed on the semiconductor layer 442 to be spaced apart from each other.

The gate electrode 424, the semiconductor layer 442, the source electrode 465 and the drain electrode 466 constituting the TFT 450 are the same as those described above with reference to FIGS. 1 and 2, and any repetitive detailed description thereof will be omitted.

In an exemplary embodiment, a first passivation layer 471, which includes or is formed of a silicon nitride-based material, is disposed on the semiconductor layer 442, the source electrode 465 and the drain electrode 466. In such an embodiment, a second passivation layer 472, which includes or is formed of a silicon nitride-based material, is disposed on the first passivation layer 471. In such an embodiment, the third passivation layer 473, which includes or is formed of a silicon nitride-based material, is disposed on the second passivation layer 472. In such an embodiment, and a planarization layer 475 is disposed on the third passivation layer 473.

In such an embodiment, the first passivation layer 471, the second passivation layer 472, the third passivation layer 473 and the planarization layer 475 are the same as the first passivation layer 171, the second passivation layer 172, the third passivation layer 173, and the planarization layer 175 of an exemplary embodiment described above with reference to FIGS. 1 and 2. Accordingly, any repetitive detailed description thereof will be omitted.

In an exemplary embodiment, the OLED 480 includes a first electrode 481, an organic light emitting layer 482 on the first electrode 481, and a second electrode 483 on the organic light emitting layer 482.

In such an embodiment, the first electrode 481 of the OLED 480 is connected to the drain electrode 466 of the TFT 450 through a contact hole defined in the planarization layer 475, the first passivation layer 471, the second passivation layer 472 and the third passivation layer 473.

Holes and electrons are injected from the first electrode 481 and the second electrode 483 into the organic light emitting layer 482, respectively. The holes and the electrons are combined with each other to form an exciton, and the OLED may emit light by energy generated when the exciton falls from an excited state to a ground state.

In an exemplary embodiment, the first electrode 481 may be a reflective electrode, and the second electrode 483 may be a transflective electrode. Accordingly, in such an embodiment, light generated in the organic light emitting layer 482 may transmit the second electrode 483 to be emitted.

In an exemplary embodiment, although not illustrated, at least one of a hole injection layer and a hole transporting layer may further be disposed between the first electrode 481 and the organic light emitting layer 482. In such an embodiment, at least one of an electron transporting layer and an electron injection layer may further be disposed between the organic light emitting layer 482 and the second electrode 483.

In an exemplary embodiment, a pixel defining layer 490 is disposed at an edge portion of the first electrode 481. The pixel defining layer 490 has an aperture. The aperture of the pixel defining layer 490 may expose a portion of the first electrode 481. In an exemplary embodiment, the second electrode 483 is disposed not only on the organic light emitting layer 482 but also on the pixel defining layer 490. The OLED 480 may emit light from the organic light emitting layer 482 disposed in the aperture of the pixel defining layer 490. Accordingly, the pixel defining layer 490 may define a light emission region.

Although not illustrated, a capping layer may be disposed on the second electrode 483. The capping layer may protect the OLED 480.

In an exemplary embodiment, a second substrate 420 is disposed on the OLED 480 to face the first substrate 410, to protect the OLED 480. The second substrate 420 may include or be formed of the same materials as that of the first substrate 410.

An inert gas such as nitrogen gas ($N_2$) may be filled in a space 425 between the second electrode 483 and the second substrate 420

In such an embodiment of the OLED display device 40, a leakage current may be effectively prevented in a gate-off state and a leakage light may be thereby effectively prevented, such that display quality may be improved.

As set forth herein, according to embodiments of the invention, a display device includes a passivation layer including a silicon nitride layer having a high content ratio of silicon, such that occurrence of a leakage current may be effectively prevented in a TFT. Accordingly, the display device may exhibit a high display quality.

From the foregoing, it will be appreciated that various embodiments in accordance with the disclosure have been described herein for purposes of illustration, and that various modifications may be made without departing from the scope and spirit of the invention. Accordingly, the various exemplary embodiments disclosed herein are not intended to be limiting of the true scope and spirit of the invention. Various features of the above described and other exemplary embodiments can be mixed and matched in any manner, to produce further exemplary embodiments consistent with the invention.

What is claimed is:
1. A display device comprising:
a first substrate;
a gate electrode on the first substrate;
a gate insulating layer on the gate electrode;
a semiconductor layer on the gate insulating layer;
a source electrode on the semiconductor layer;
a drain electrode on the semiconductor layer and spaced apart from the source electrode;
a first passivation layer on the semiconductor layer, the source electrode and the drain electrode, wherein the first passivation layer comprises a silicon nitride-based material;

a second passivation layer on the first passivation layer, wherein the second passivation layer comprises a silicon nitride-based material; and a third passivation layer on the second passivation layer, wherein the third passivation layer comprises a silicon nitride-based material, wherein a content ratio of silicon in the first passivation layer is higher than a content ratio of silicon in the second passivation layer, and the content ratio of silicon in the second passivation layer is higher than a content ratio of silicon in the third passivation layer.

2. The display device of claim 1, wherein the silicon nitride-based material of the first passivation layer comprises a composition of $SiN_x$, wherein x satisfies the following inequation: $0.1 \leq x \leq 0.4$.

3. The display device of claim 1, wherein
the silicon nitride-based material of the second passivation layer comprises a composition of $SiN_y$, wherein y satisfies the following inequation: $0.7 \leq y \leq 1.5$, and
the silicon nitride-based material of the third passivation layer comprises a composition of $SiN_z$, wherein z satisfies the following inequation: $15 \leq z \leq 25$.

4. The display device of claim 1, wherein
the silicon nitride-based material of the first passivation layer comprises a Si—H group and a N—H group, and
a content ratio of the N—H group to the Si—H group is in a range of about 0.1 to about 0.4.

5. The display device of claim 1, wherein the first passivation layer has a thickness in a range of about 15 nanometers to about 30 nanometers.

6. The display device of claim 1, wherein a gate-off voltage in a range of about −4.9 volts to about −2.7 volts is applied to the gate electrode.

7. The display device of claim 1, further comprising:
a first electrode on the first substrate,
wherein the first electrode is connected to the drain electrode.

8. The display device of claim 7, further comprising:
a color filter between the third passivation layer and the first electrode.

9. The display device of claim 7, further comprising:
a second substrate on the first electrode and opposite to the first substrate; and
a liquid crystal layer between the first substrate and the second substrate.

10. The display device of claim 7, further comprising:
a light emitting layer on the first electrode; and
a second electrode on the light emitting layer.

11. A method of manufacturing a display device, the method comprising:
providing a gate electrode on a first substrate of the display device;
providing a gate insulating layer on the gate electrode;
providing a semiconductor layer on the gate insulating layer;
providing a source electrode and a drain electrode on the semiconductor layer to be spaced apart from each other;
providing a first passivation layer on the semiconductor layer, the source electrode and the drain electrode, wherein the first passivation layer comprises a silicon-nitride material;
providing a second passivation layer on the first passivation layer, wherein the second passivation layer comprises a silicon-nitride material; and providing a third passivation layer on the second passivation layer, wherein the third passivation layer comprises a silicon-nitride material, wherein a content ratio of silicon in the first passivation layer is higher than a content ratio of silicon of the second passivation layer, and the content ratio of silicon in the second passivation layer is higher than a content ratio of silicon in the third passivation layer.

12. The method of claim 11, wherein each of the providing the first passivation layer, the providing the second passivation layer, and the providing the third passivation layer comprises performing a deposition process using $NH_3$ gas, $SiH_4$ gas and $N_2$ gas.

13. The method of claim 11, wherein
the silicon-nitride material of the first passivation layer comprises a composition of $SiN_x$, wherein x satisfies the following inequation: $0.1 \leq x \leq 0.4$.

14. The method of claim 11, wherein
the silicon-nitride material of the second passivation layer comprises a composition of $SiN_y$, wherein y satisfies the following inequation: $0.7 \leq y \leq 1.5$, and
the silicon-nitride material of the third passivation layer comprises a composition of $SiN_z$, wherein z satisfies the following inequation: $15 \leq z \leq 25$.

15. The method of claim 11, further comprising:
disposing a second substrate to face the first substrate; and
providing a liquid crystal layer between the first substrate and the second substrate.

16. A semiconductor device comprising:
a first substrate;
a gate electrode on the first substrate;
a gate insulating layer on the gate electrode;
a semiconductor layer on the gate insulating layer;
a source electrode on the semiconductor layer;
a drain electrode on the semiconductor layer and spaced apart from the source electrode;
a first passivation layer on the semiconductor layer, the source electrode and the drain electrode, wherein the first passivation layer comprises a silicon nitride-based material;
a second passivation layer on the first passivation layer, wherein the second passivation layer comprises a silicon nitride-based material; and
a third passivation layer on the second passivation layer, wherein the third passivation layer comprises a silicon nitride-based material,
wherein a content ratio of silicon in the first passivation layer is higher than a content ratio of silicon in the second passivation layer, and
the content ratio of silicon in the second passivation layer is higher than a content ratio of silicon in the third passivation layer.

17. The semiconductor device of claim 16, wherein
the silicon nitride-based material of the first passivation layer comprises a composition of $SiN_x$, wherein x satisfies the following inequation: $0.1 \leq x \leq 0.4$.

18. The semiconductor device of claim 16, wherein
the silicon nitride-based material of the second passivation layer comprises a composition of $SiN_y$, wherein y satisfies the following inequation: $0.7 \leq y \leq 1.5$, and
the silicon nitride-based material of the third passivation layer comprises a composition of $SiN_z$, wherein z satisfies the following inequation: $15 \leq z \leq 25$.

19. The semiconductor device of claim 16, wherein the first passivation layer has a thickness in a range of about 15 nanometers to about 30 nanometers.

20. The semiconductor device of claim 16, wherein the semiconductor layer comprises a silicon-based semiconductor.

\* \* \* \* \*